US008046912B2

(12) United States Patent
Kubota et al.

(10) Patent No.: US 8,046,912 B2
(45) Date of Patent: Nov. 1, 2011

(54) METHOD OF MAKING A CONNECTION COMPONENT WITH POSTS AND PADS

(75) Inventors: Yoichi Kubota, Pleasanton, CA (US);
Teck-Gyu Kang, San Jose, CA (US);
Jae M. Park, San Jose, CA (US);
Belgacem Haba, Saratoga, CA (US)

(73) Assignee: Tessera, Inc., San Jose, CA (US)

( * ) Notice: Subject to any disclaimer, the term of this patent is extended or adjusted under 35 U.S.C. 154(b) by 96 days.

(21) Appl. No.: 12/321,210

(22) Filed: Jan. 16, 2009

(65) Prior Publication Data
US 2009/0133254 A1 May 28, 2009

Related U.S. Application Data

(60) Division of application No. 11/166,982, filed on Jun. 24, 2005, now Pat. No. 7,495,179, which is a continuation-in-part of application No. 10/959,465, filed on Oct. 26, 2004, now Pat. No. 7,462,936.

(60) Provisional application No. 60/583,109, filed on Jun. 25, 2004, provisional application No. 60/533,210, filed on Dec. 30, 2003, provisional application No. 60/533,393, filed on Dec. 30, 2003, provisional application No. 60/533,437, filed on Dec. 30, 2003, provisional application No. 60/508,970, filed on Oct. 6, 2003.

(51) Int. Cl.
*H05K 3/02* (2006.01)
(52) U.S. Cl. ............... 29/847; 29/830; 174/262; 439/66
(58) Field of Classification Search ............... 174/262, 174/267; 257/737; 438/701; 439/66; 29/830, 29/831, 846–849, 852, 729
See application file for complete search history.

(56) References Cited

U.S. PATENT DOCUMENTS

| 4,695,870 A | 9/1987 | Patraw |
| 4,716,049 A | 12/1987 | Patraw |
| 4,804,132 A | 2/1989 | DiFrancesco |
| 4,902,600 A | 2/1990 | Tamagawa et al. |

(Continued)

FOREIGN PATENT DOCUMENTS
EP 1602749 12/2005
(Continued)

OTHER PUBLICATIONS

North Corporation, "Processed Intra-layer Interconnection Material for PWBs [Etched Copper Bump with Copper Foil]," NMBI™, Version 2001.6.

(Continued)

*Primary Examiner* — Donghai D. Nguyen
(74) *Attorney, Agent, or Firm* — Lerner, David, Littenberg, Krumholz & Mentlik, LLP

(57) ABSTRACT

A packaged microelectronic element includes connection component incorporating a dielectric layer (22) carrying traces (58) remote from an outer surface (26), posts (48) extending from the traces and projecting beyond the outer surface of the dielectric, and pads (30) exposed at the outer surface of the dielectric layer, the pads being connected to the posts by the traces. The dielectric element overlies the front surface of a microelectronic element, and contacts (74) exposed on the front surface of the microelectronic element are connected to the pads by elongated leads (76) such as wire bonds. Methods of making the connection component are also disclosed.

15 Claims, 7 Drawing Sheets

U.S. PATENT DOCUMENTS

| | | |
|---|---|---|
| 4,924,353 A | 5/1990 | Patraw |
| 4,975,079 A | 12/1990 | Beaman et al. |
| 4,982,265 A | 1/1991 | Watanabe et al. |
| 5,068,714 A | 11/1991 | Seipler |
| 5,083,697 A | 1/1992 | Difrancesco |
| 5,138,438 A | 8/1992 | Masayuki et al. |
| 5,148,265 A | 9/1992 | Khandros et al. |
| 5,148,266 A | 9/1992 | Khandros et al. |
| 5,189,505 A | 2/1993 | Bartelink |
| 5,196,726 A | 3/1993 | Nishiguchi et al. |
| 5,214,308 A | 5/1993 | Nishiguchi et al. |
| 5,397,997 A | 3/1995 | Tuckerman et al. |
| 5,409,865 A | 4/1995 | Karnezos |
| 5,455,390 A | 10/1995 | DiStefano et al. |
| 5,518,964 A | 5/1996 | DiStefano et al. |
| 5,615,824 A | 4/1997 | Fjelstad et al. |
| 5,656,550 A | 8/1997 | Tsuji et al. |
| 5,659,952 A | 8/1997 | Kovac et al. |
| 5,679,977 A | 10/1997 | Khandros et al. |
| 5,731,709 A | 3/1998 | Pastore et al. |
| 5,798,286 A | 8/1998 | Faraci et al. |
| 5,802,699 A | 9/1998 | Fjelstad et al. |
| 5,811,982 A | 9/1998 | Beaman et al. |
| 5,854,507 A | 12/1998 | Miremadi et al. |
| 5,973,391 A | 10/1999 | Bischoff et al. |
| 5,980,270 A | 11/1999 | Fjelstad et al. |
| 6,001,671 A | 12/1999 | Fjelstad |
| 6,032,359 A | 3/2000 | Carroll |
| 6,052,287 A | 4/2000 | Palmer et al. |
| 6,054,756 A | 4/2000 | DiStefano et al. |
| 6,175,159 B1 | 1/2001 | Sasaki et al. |
| 6,177,636 B1 | 1/2001 | Fjelstad |
| 6,202,297 B1 | 3/2001 | Faraci et al. |
| 6,217,972 B1 | 4/2001 | Beroz et al. |
| 6,258,625 B1 | 7/2001 | Brofman et al. |
| 6,307,260 B1 * | 10/2001 | Smith et al. ..................... 439/66 |
| 6,332,270 B2 | 12/2001 | Beaman et al. |
| 6,358,627 B2 | 3/2002 | Benenati et al. |
| 6,362,525 B1 | 3/2002 | Rahim |
| 6,458,411 B1 | 10/2002 | Goossen et al. |
| 6,495,914 B1 | 12/2002 | Sekine et al. |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,545,228 B2 | 4/2003 | Hashimoto et al. |
| 6,550,666 B2 | 4/2003 | Chew et al. |
| 6,555,918 B2 | 4/2003 | Masuda et al. |
| 6,560,117 B2 | 5/2003 | Moon |
| 6,578,754 B1 | 6/2003 | Tung |
| 6,589,870 B1 | 7/2003 | Katoh et al. |
| 6,624,653 B1 | 9/2003 | Cram |
| 6,647,310 B1 | 11/2003 | Yi et al. |
| 6,681,982 B2 | 1/2004 | Tung |
| 6,782,610 B1 | 8/2004 | Iijima et al. |
| 6,870,274 B2 | 3/2005 | Huang et al. |
| 6,902,869 B2 | 6/2005 | Appelt et al. |
| 7,043,831 B1 | 5/2006 | Farnworth et al. |
| 7,115,495 B2 | 10/2006 | Wark et al. |
| 2002/0056906 A1 | 5/2002 | Kajiwara et al. |
| 2002/0125571 A1 | 9/2002 | Corisis et al. |
| 2002/0153602 A1 | 10/2002 | Tay et al. |
| 2003/0107118 A1 | 6/2003 | Pflughaupt et al. |
| 2003/0132518 A1 | 7/2003 | Castro |
| 2003/0164540 A1 | 9/2003 | Lee et al. |
| 2004/0031972 A1 | 2/2004 | Pflughaupt et al. |
| 2004/0201096 A1 | 10/2004 | Iijima et al. |
| 2004/0245213 A1 | 12/2004 | Fukase et al. |
| 2005/0097727 A1 * | 5/2005 | Iijima et al. ..................... 29/729 |
| 2005/0101136 A1 | 5/2005 | Mori |
| 2005/0116326 A1 | 6/2005 | Haba et al. |
| 2005/0124091 A1 | 6/2005 | Fukase et al. |
| 2005/0285246 A1 | 12/2005 | Haba et al. |
| 2007/0017090 A1 | 1/2007 | Sakai et al. |

FOREIGN PATENT DOCUMENTS

| | | |
|---|---|---|
| JP | 62-68015 A | 9/1994 |
| JP | 2002-313996 A | 10/2002 |

OTHER PUBLICATIONS

Neo-Manhattan Technology, A Novel HDI Manufacturing Process, "High-Density Interconnects for Advanced Flex Substrates & 3-D Package Stacking," IPC Flex & Chips Symposium, Tempe, AZ, Feb. 11-12, 2003.

Co-Pending U.S. Appl. No. 11/166,982, Non-final Rejection dated Mar. 21, 2008.

Co-Pending U.S. Appl. No. 11/166,982, Amendment dated Jun. 23, 2008.

International Search Report, PCT/US2008/03473.

Office Action from Japanese Application No. 2007-518347 dated Feb. 1, 2011.

* cited by examiner

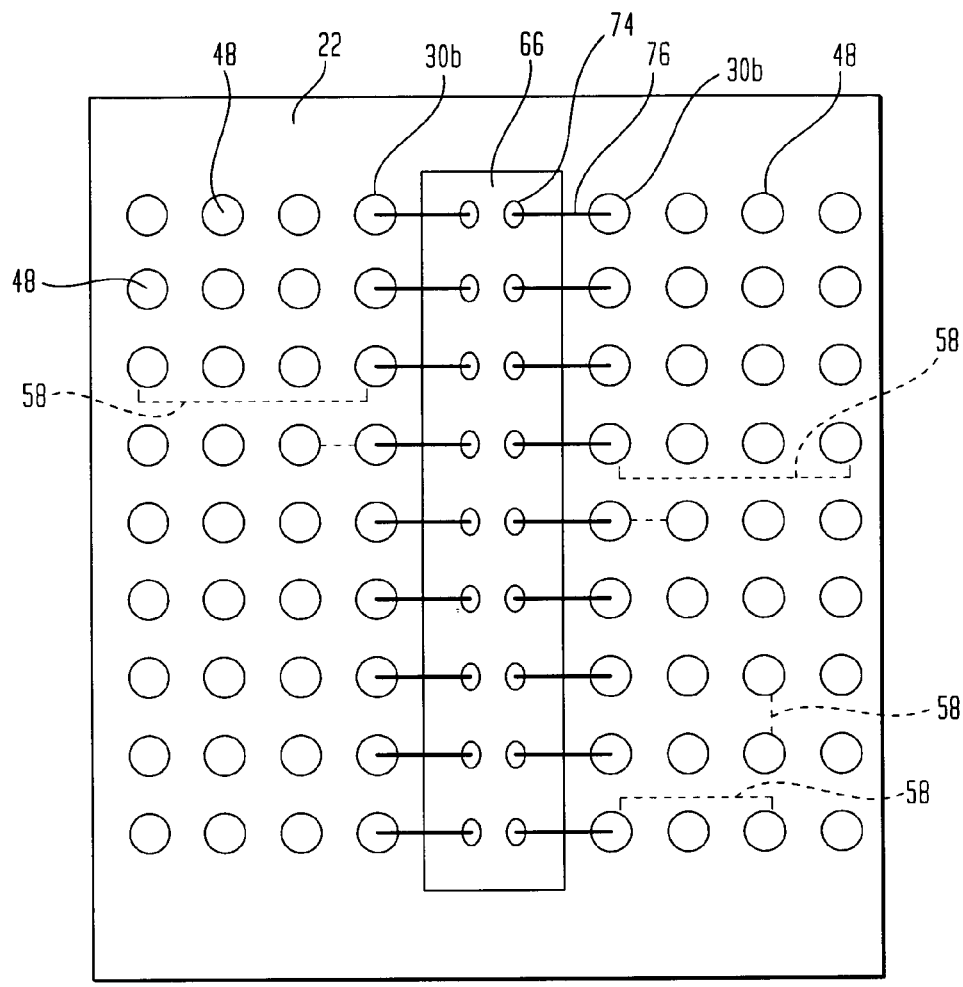
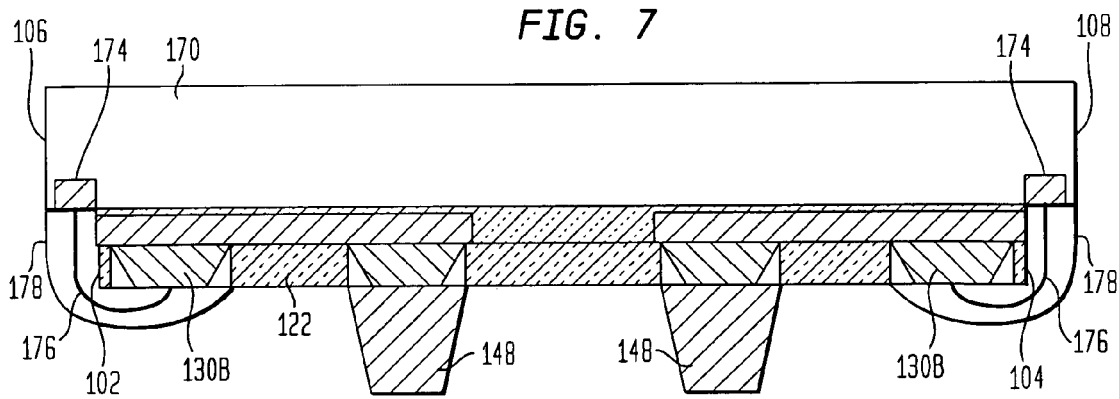

METHOD OF MAKING A CONNECTION COMPONENT WITH POSTS AND PADS

CROSS-REFERENCE TO RELATED APPLICATIONS

The present application is a division of U.S. patent application Ser. No. 11/166,982, filed Jun. 24, 2005, issued as U.S. Pat. No. 7,495,179, which is a continuation-in-part of U.S. patent application Ser. No. 10/959,465, filed Oct. 6, 2004, issued as U.S. Pat. No. 7,462,936, which application claims the benefit of the filing dates of U.S. Provisional Patent Application Nos. 60/533,210, 60/533,393, and 60/533,437, all of which were filed Dec. 30, 2003; and U.S. Provisional Patent Application No. 60/508,970 filed Oct. 6, 2003. The present application also claims the benefit of the filing date of U.S. Provisional Patent Application No. 60/583,109, filed Jun. 25, 2004, the disclosure of which is hereby incorporated by reference herein.

BACKGROUND OF THE INVENTION

The present invention relates to components and assemblies useful in microelectronic assemblies, to assemblies incorporating such components and to methods of making such components.

Microelectronic elements such as semiconductor chips typically are provided in packages which protect the semiconductor chip itself from the external environment and which facilitate mounting the chip on a circuit board. For example, some microelectronic packages include a connection component incorporating a dielectric element such as a board or sheet having top and bottom surfaces and having electrically conductive terminals exposed at the bottom surface. The chip is mounted to the top surface and connected to the terminals by various arrangements such as electrically conductive traces extending on a surface of the dielectric element, or within the dielectric element. The chip typically has a front surface with small contacts thereon and an oppositely-facing rear surface. The chip may be mounted in a face-down arrangement, so that the front surface of the chip confronts the top surface of the dielectric element and the rear surface of the chip faces upwardly, away from the dielectric element. In other cases, the chip may be mounted in a face-up arrangement, with the rear surface of the chip facing downwardly toward the top surface of the dielectric element. The contacts on the front face of the chip typically are connected to the traces on the dielectric element either by direct bonds between the contacts and leads formed integrally with the traces, or by wire bonds. As disclosed, for example, in U.S. Pat. No. 6,177,636, the disclosure of which is incorporated by reference herein, similar chip packages can be made with terminals in the form of posts projecting from the bottom surface of the dielectric element. The posts can be fabricated using an etching process. As disclosed in commonly assigned, co-pending U.S. Provisional Patent Applications 60/533,210; 60/533,393; and 60/533,437, all filed Dec. 30, 2003, the disclosures of which are incorporated by reference herein, packages utilizing posts can provide numerous advantageous features. For example, the posts and the dielectric layer or layers can be configured to promote tilting of the posts when the tips of the posts are engaged with a test socket, to facilitate effected contact between the tips of the posts and the contacts of the test socket.

Efforts have been made to fabricate electronic connection structures such as individual layers for multi-layer circuit boards using a metallic post structure. In one process, disclosed by the North Corporation of Tokyo, Japan, a metallic plate is etched to form numerous metallic posts projecting from the plate. A dielectric layer is applied to this plate so that the posts project through the dielectric layer. An inner or upper side of the dielectric layer faces upwardly toward the metallic plate, whereas the outer or lower side of the dielectric layer faces downwardly towards the tip of the posts. The dielectric layer may be fabricated by coating a dielectric such as polyimide onto the plate around the posts or, more typically, by forcibly engaging the posts with the dielectric sheet so that the posts penetrate through the sheet. Once the sheet is in place, the metallic plate is etched to form individual traces on the inner side of the dielectric layer extending to the bases of the various posts.

The components made by this process suffer from certain drawbacks for use as connection components in certain types of semiconductor chip packages. For example, it is often desirable to mount a chip in a face-down orientation and connect the contacts on the chip to the traces of the connection component using wire bonds which extend from the chip through a large opening or slot in the dielectric element, or around the edges of the dielectric element, and approach the outer or bottom surface of the dielectric element. Such a wire bond can be formed in a simple, one-step bonding operation. However, in the aforementioned process, the traces are formed on the inner or upper side of the dielectric element. Therefore, the traces are not exposed for making such a simple, one-step wire bond connection to the contacts on the chip.

One solution to this problem is to use a two-step wire-bonding procedure, in which the bonding wires are connected to the traces before the chip is placed on the component, leaving free ends of the wires projecting across the slot or beyond the edges of the dielectric element. After placing the chip on the connection component, the free ends of the wires remain accessible so that the free ends of the wires can be bonded to the contacts of the chip in a second bonding step. The two-step bonding process, however, adds to the cost and complexity of the assembly procedure, and creates the risk of defects such as adhesive contamination of the chip contacts or bonding wires during the chip mounting step and misalignment of the free ends of the bonding wires with the chip contacts.

As disclosed in certain embodiments of co-pending, commonly assigned U.S. Provisional Patent Application 60/508, 970, filed Oct. 6, 2003, the disclosure of which is hereby incorporated by reference herein, a connection component including posts can be provided with pads exposed at the bottom or outer surface of the dielectric. The component can be fabricated by uniting a metallic sheet having posts thereon with a dielectric layer as discussed above, so that the metallic sheet is disposed on the top or inner surface of the dielectric layer and the posts project through the dielectric layer and project beyond the bottom surface of the dielectric layer. Some of the posts are crushed, abraded or otherwise treated so as to convert these posts to pads which project only slightly from the outer or bottom surface of the dielectric. The metallic sheet is etched to form traces which connect the pads to the posts. The pads may be formed adjacent edges of the dielectric, or adjacent slots in the dielectric. Such a component may be assembled with a chip in face-down orientation, with the contacts of the chip disposed outside of the edges of the dielectric or in alignment with the slots in the dielectric. The pads, and hence the traces and posts, can be connected to the contacts on the chip by a simple, one-step wire-bonding procedure.

SUMMARY OF THE INVENTION

One aspect of the invention provides connection components for mounting microelectronic elements. A connection component according to this aspect of the invention desirably includes a dielectric layer having an upwardly-facing inside surface and a downwardly-facing outer surface. The connection component desirably has electrically conductive traces extending on the dielectric layer remote from said outside face as, for example, on the inside surface or within the thickness of the dielectric layer. Electrically conductive posts extend from the traces through the dielectric layer and project downwardly beyond the outer surface of the dielectric layer. The component according to this aspect of the invention desirably includes electrically conductive pads exposed at the outside face of the dielectric layer, at least some of said pads being electrically connected to at least some of said posts by at least some of said traces.

The posts can be used for mounting the component, and hence a microelectronic element carried by the component, to a circuit panel such as a circuit board as, for example, by solder-bonding the ends of the posts remote from the dielectric layer to the circuit panel. The pads can be used for making connections with a microelectronic element mounted to the component. In a particularly preferred arrangement, the pads are used for wire-bonding. Desirably, the pads are disposed near edges of the dielectric layer or near a slot or other opening in the dielectric layer.

A further aspect of the invention provides a packaged microelectronic element including a component as discussed above and a microelectronic element mounted to the component. The dielectric layer of the component most typically overlies the contact-bearing or front surface of the microelectronic element, and at least some of the contacts of the microelectronic element are connected to at least some of the pads of the component. Most preferably, this connection includes elongated leads such as wire bonds extending around the edges of the component or through an opening in the component.

A further aspect of the invention provides methods of making connection components. A method according to this aspect of the invention desirably begins with a starting structure which includes a dielectric layer and electrically conductive elements referred to herein as connectors, with an outer electrically conductive layer covering the connectors. The method most preferably includes the step of treating the outer electrically conductive layer so as to remove at least some of this layer at pad locations while leaving at least some of this layer at post locations. The treatment thus forms pads and posts incorporating the connectors. For example, the treating step may be performed so as to remove the entire thickness of the outer conductive layer at the pad locations, thereby forming pads consisting only of the connectors, and to leave the entire thickness of the outer conductive layer at the post locations, leaving posts which include the connectors together with portions formed from the material of the conductive layer.

BRIEF DESCRIPTION OF THE DRAWINGS

FIG. 6 is a diagrammatic plan view of the assembly shown in FIG. 4, with portions removed for clarity of illustration.

FIG. 7 is a diagrammatic sectional view depicting a packaged microelectronic element and connection component in accordance with a further embodiment of the invention.

Each of FIGS. 14-17 is a diagrammatic sectional view depicting a connection component and packaged semiconductor chip in accordance with a further embodiment of the invention.

Figure 18:
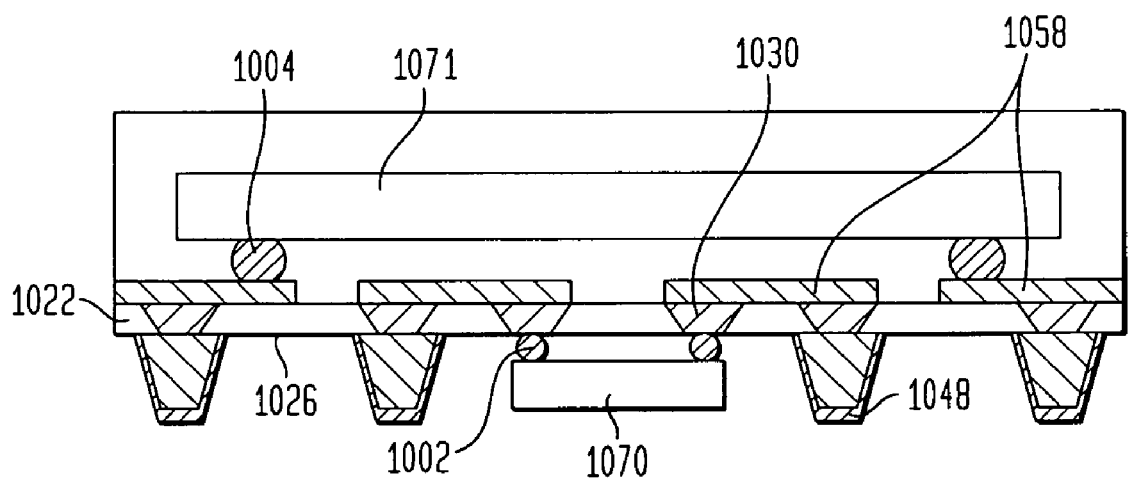

FIG. 18 is a view similar to FIGS. 14-17, but depicting an assembly incorporating a packaged microelectronic element in conjunction with an additional microelectronic element.

DETAILED DESCRIPTION

A method of fabricating a component in accordance with one embodiment of the invention utilizes a dielectric layer 22 (FIG. 1) having an inside surface 24 facing upwardly and an outer surface 26 facing downwardly. As used in this disclosure, terms such as "upwardly," "downwardly," "vertically" and "horizontally" should be understood as referring to the frame of reference of the element specified and need not conform to the normal gravitation frame of reference. The dielectric layer has holes 28 extending between the top and bottom surfaces. The dielectric layer may be of any thickness, but most typically is about 10-100 μm thick. It may be a solid, uniform layer such as a layer of a polyimide, BT resin or other material of the type commonly used in forming flexible circuit panels, or may be a reinforced layer such as a fiberglass-reinforced epoxy. The dielectric layer may also include internal conductive structures such as ground planes or layers of traces. Typically, any such internal conductive layers are isolated from most or all of the holes 28 so that they do not make contact with conductive elements positioned in the holes as discussed below.

The process also uses an electrically-conductive inner conductive layer 30, desirably formed from a metal such as copper or a copper-based alloy, most typically about 5-50 μm thick. Layer 30 is a unitary structure having projections 32 referred to herein as "connectors" formed integrally with the remainder of the layer and extending from one side of the layer. Connectors 32 are disposed in a pattern corresponding to the pattern of holes 28 in the dielectric layer. A planar outer conductive layer 34, formed from an etchable conductive material, desirably a metal such as copper or a copper-based alloy, is also employed. Outer conductive layer 34 most typically is about 50-300 μm thick.

Figure 2:
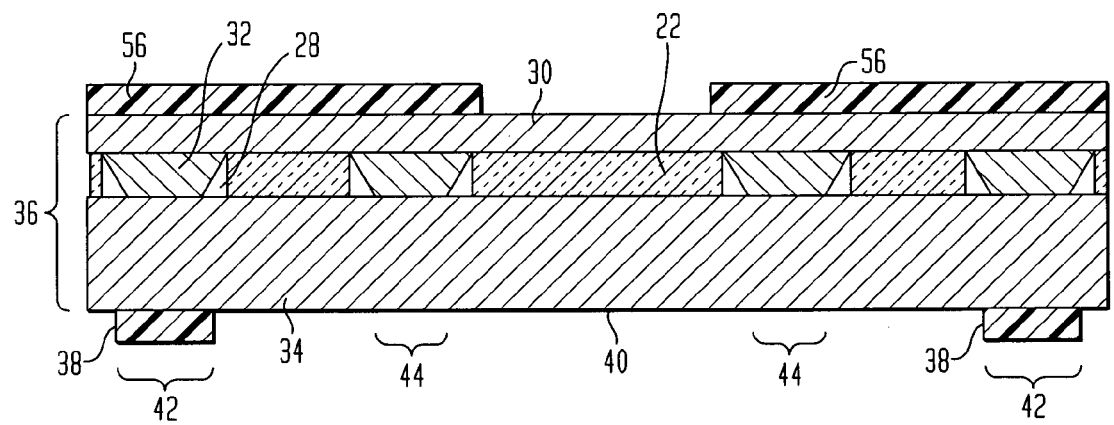
FIG. 2 is a view similar to FIG. 1, but depicting the elements at a later stage during the process.

In one stage of the process, the conductive layers and dielectric layers are laminated to form an in-process structure 36 (FIG. 2). The lamination process is performed so that connectors 32 extend through holes 28 in the dielectric layer 22 and abut outer layer 34. To assure abutting contact, the height of projections 32 prior to lamination may be slightly greater than the thickness of dielectric layer 22, and the layers are squeezed together in a press or nip so that the projections 32 are slightly flattened by engagement with outer layer 34. Most preferably the abutting surfaces of the projections 32 and layer 34 are bonded to one another. For example, these surfaces may be bonded by applying an electrically current between layers 30 and 32 to perform electrical resistance welding at the abutting surfaces. Also, sonic or ultrasonic energy may be applied to promote welding of connectors 32 and outer layer 34. Alternatively or additionally, the abutting surfaces of connectors 32, layer 34, or both may be provided with thin layers of bonding materials (not shown) such as eutectic bonding alloys or solder, which are activated during the bonding process.

In the in-process unit 36, inner conductive layer 30 adheres to the upper surface of dielectric layer 24. Such adhesion may be provided by a layer of adhesive (not shown) carried on one of these layers. Alternatively, the dielectric layer may be provided in a partially-cured state and further cured in contact with layer 30 during the lamination process. Although the individual layers are depicted separately in FIG. 1, the dielectric layer 22 most typically is carried into the lamination process on inner layer 30 or on outer layer 34. For example, the dielectric layer may be provided with holes 28, as by ablating, punching or etching a continuous dielectric layer to form the holes, and then laminated to the outer conductive layer. Alternatively, dielectric layer 22 may be formed in place on either conductive layer, as by coating the conductive layer with a liquid precursor and then curing the precursor to form the dielectric. Where the dielectric is a photosensitive material, such as a photosensitive material of the type commonly used as a solder mask on electronic components, the holes 28 may be formed by photographically patterning the dielectric. In a further variant, a completely or partially cured solid dielectric layer without pre-formed holes may be forcibly engaged with an inner or outer conductive layer bearing connectors so that the connectors penetrate through the dielectric layer. The connectors may be formed with sharp points or sharp edges to facilitate this process.

In-process unit 36 (FIG. 2) thus has inner and outer conductive layers 30 and 34 connected with one another by connectors 32 extending through the dielectric layer 22 disposed between the conductive layers.

In a further stage of the process, the outer conductive layer 34 of the in-process unit is treated. In this treatment step an etch-resistant material such as a photoresist 38 is applied on the outer surface 40 of the layer at locations 42, referred to herein as "post locations," aligned with some of the connectors 32. The etch-resistant material is omitted at locations other than the post locations. In particular, locations 44, referred to herein as "pad locations," aligned with other connectors 32, are not covered by the etch-resistant material. The etch-resistant material may be applied by conventional photographic patterning procedures. After application of resist 38, the outer surface 40 of layer 34 is exposed to an etchant which attacks the material of layer 34. The etchant exposure is continued for a time sufficient to remove the entire thickness of layer 34 at locations such as pad locations 44. At post locations 42, the entire thickness of layer 34 remains, so as to form a set of posts 48 projecting beyond the outer surface 26 of the dielectric layer by a projection distance $D_P$. Merely by way of example, $D_P$ may be about 50 to about 300 μm. Each post includes an upper portion formed from one of the connectors 30, such as connector 30a (FIG. 3) and a lower portion 50 formed from the material originally present in outer layer 34. The lower portion defines a base surface 52 at the juncture between the upper and lower portions. In the particular embodiment depicted, the base surfaces have horizontal dimensions (in directions parallel to the surfaces of the dielectric layer) greater than the horizontal dimensions of the upper portions 30a at such juncture. Stated another way, the horizontal dimensions of the post increase at the juncture between the upper portion 30a and the lower portion 50.

At pad locations 44, downwardly-facing surfaces 54 (FIG. 3) of connectors 32 are exposed by removal of the outer conductive layer 34 (FIG. 2). Thus, connectors 32 form pads with surfaces exposed at the outer or bottom surface 26 of the dielectric layer. In the particular embodiment depicted, the exposed surfaces 54 of the pads 30b are exactly flush with outer surface 26 of the dielectric layer, but this is not essential; the exposed surfaces may be recessed relative to outer surface 26, or may project beyond such surface as discussed below. As used in this disclosure, an electrically conductive feature can be considered "exposed at" a surface of a dielectric layer if the metallic feature is accessible to a contact or bonding material applied to such surface. Thus, a metallic feature which projects from the surface of the dielectric or which is flush with the surface of the dielectric is exposed at such surface; whereas a recessed conductive feature disposed in or aligned with a hole in the dielectric extending to the surface of the dielectric is also exposed at such surface.

In a further stage of the process, the inner conductive layer 30 of in-process unit 36 is treated by patterning a further photoresist or other etch-resistant material 56 (FIG. 2) on this layer and then exposing this layer to an etchant to remove those portions not covered by the photoresist. The remaining portions of the inner conductive layer form traces 58 (FIG. 3) extending between at least some of the pad locations 44 and at least some of the post locations 42, so that these traces electrically connect at least some of pads 30a with at least some of posts 48. Although only two pads 30b are depicted in the sectional view of FIG. 3, numerous pads desirably are formed in two parallel, spaced-apart rows extending in the direction into and out of the plane of the drawing in FIG. 3. The exposed surfaces 54 of the pads and the surfaces of the posts may be plated with oxidation-resistant metals such as nickel and gold.

A slot 66 is formed in the central region of the dielectric layer so that the slot extends between the rows of pads 30b, and the pads are disposed adjacent the edges of the slot. Slot 66 may be formed, by example, by mechanically punching the dielectric layer; by ablating the dielectric layer using a laser or other concentrated energy source; or by chemically etching the dielectric layer. The completed connection component thus has the configuration shown in FIG. 3, with pads disposed in slot-edge regions adjacent the edges of the slot, whereas the posts 48 are provided in other regions of the dielectric layer.

Figure 3:
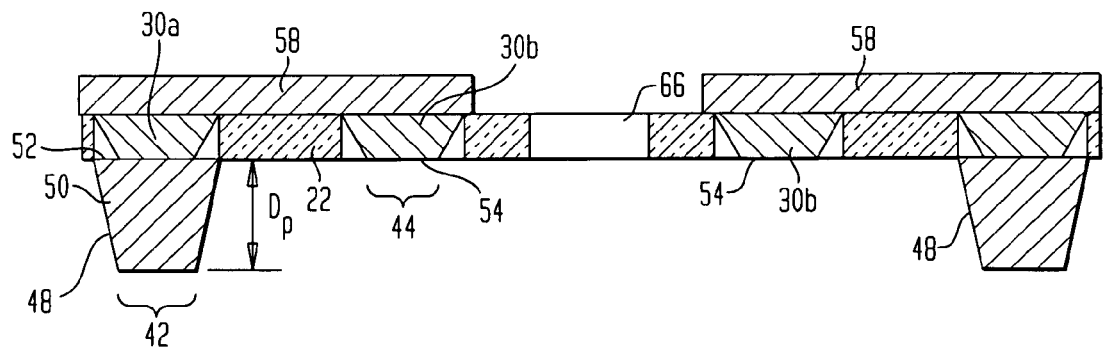
FIG. 3 is a diagrammatic sectional view of the component formed in the process of FIGS. 1 and 2.

The order of steps used to make the component can be varied from that discussed above. For example, although the steps of treating the outer conductive layer 34 and inner conductive layer 30 have been described sequentially above for ease of understanding, these steps may be performed in any order or simultaneously. For example, both the inner and outer conductive layers may be etched simultaneously after application of photoresists 38 and 56 (FIG. 2). Also, the conductive layer 30 may be in the form of individual conductive features or traces 58 when initially united with the dielectric layer. For example, the traces 58 may be formed by selective deposition on the dielectric layer before or after treatment of the outer conductive layer. If the inner conductive layer 30 or traces 58 is formed by deposition on the inner surface 24 before treatment of the outer conductive layer, connectors 32 may be formed in the same deposition step. In a further variant, the connectors 30 (FIG. 1) may be initially formed on the outer conductive layer rather than on the inner conductive layer. In this case, the outer conductive layer may be treated before or after application of the inner conductive layer or traces. Also, the step of forming a slot in the dielectric layer can be performed before or after the other steps of the process. Also, the various steps can be, and most preferably are, conducted while the dielectric layer 22 is part of a larger sheet or tape. Individual connection components as depicted in FIG. 3 can be obtained by severing such a sheet or tape. Most typically, however, the connection components are left in the form of a sheet or tape until after semiconductor chips or other devices are mounted to the components.

Other methods of forming in-process unit 36 (FIG. 2) may be used. Merely by way of example, layer 22 may be cast or molded around connectors 32 as, for example, by engaging the inner conductive layer 30, connectors 32 and outer conductive layer 34 in a compression mold or injection mold, and injecting an uncured dielectric around the connectors so as to form the dielectric layer in place. Alternatively, the dielectric may be applied as a flowable material and may flow to form a layer surrounding the connectors under the influence of gravity or under the influence of centrifugal force applied in a centrifuge or similar device.

Figure 4:
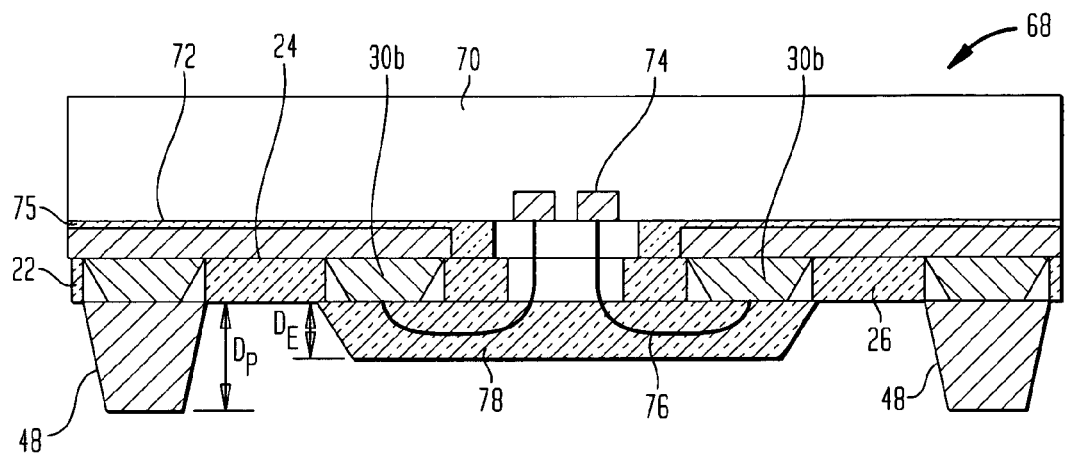
FIG. 4 is a diagrammatic sectional view depicting a packaged microelectronic element incorporating the component of FIG. 3.

A packaged microelectronic element 68 (FIG. 4) made using the component of FIG. 3 incorporates a semiconductor chip or other microelectronic element 70 having a front face 72 and contacts 74 disposed in one or more rows on the front face. The component and semiconductor chip are assembled so that the dielectric layer 22 of the component overlies the front face, with the inner surface 24 of the dielectric layer facing toward the front face of the chip. The rows of contacts 74 on the chip are aligned with the slot 66 in the dielectric layer. A die attach layer 75 is provided between the front face of the chip and the inside surface of the dielectric layer. Typically, this die attach layer includes a dielectric adhesive. Optionally, the die attach layer may include a compliant layer so as to facilitate movement of posts 48 and other elements of the connection component relative to the chip during testing and service.

The contacts 74 of the chip are connected to pads 62 by wire bonds 76 extending through slot 66. After the contacts have been wire-bonded to the pads, a dielectric encapsulant 78 is applied over the pads and wire bonds and typically fills slot 66, so that the encapsulant covers the contact 74 on the chip and also contacts the die attach material 75. An additional overmold (not shown) may be provided around the chip, so that the overmold covers the exposed edges of the chip and, in some applications, also covers the upwardly-facing rear surface of the chip to provide additional physical protection.

Desirably, the height or projection distance of the encapsulant $D_E$ from the bottom or outer surface 26 is less than or equal to the height or projection distance $D_P$ of the posts. Also, the height or projection distance of the wire bonds 76 is less than $D_P$ and less than $D_E$, so that the wire bonds are entirely covered by the encapsulant. Stated another way, the difference in height or projection distance between the pads 30b and posts 48 is sufficient to accommodate the thickness of the wire bonds 76 overlying the pads and the thickness of the encapsulant overlying the wire bonds. The wire-bonding and encapsulation steps may be performed using conventional equipment and procedures. In particular, the wire-bonding step can be performed in a single bonding operation using a bonding tool which approaches the assembly from the outer or bottom side 26 of the dielectric layer. As mentioned above, the components are typically provided in the form of a sheet or tape including numerous components. The chips are mounted to these components and the wire-bonding and encapsulation procedures preferably are performed while the connection components are in the form of a sheet or tape. After the procedures have been formed, the sheet or tape typically is severed so as to yield numerous individual units, each incorporating one or more chips.

The packaged chips can be tested by engaging posts 48 with a test fixture (not shown). In some cases, the posts 30 may be displaced vertically towards or away from chip 70 during the testing procedure, so as to assure proper engagement of all of the posts 30 with the test fixture. Such movement can be facilitated by making the dielectric layer 22 and traces 58 flexible and by providing compressibility in the die attach layer 75. In addition, the posts, the dielectric layer and the die attach layer can be provided with features as shown in the aforementioned co-pending applications 60/533,210; 60/533,393; and 60/533,437 to promote movement of the posts and, preferably, tilting of the posts during engagement with the test fixture. The testing operation can be performed before or after severance of the individual units of the tape and before or after application of encapsulant 78. If the testing operation is performed before application of the encapsulant and overmold, defective wire bonds 76, detected in the testing operation, can be reworked.

Figure 5:
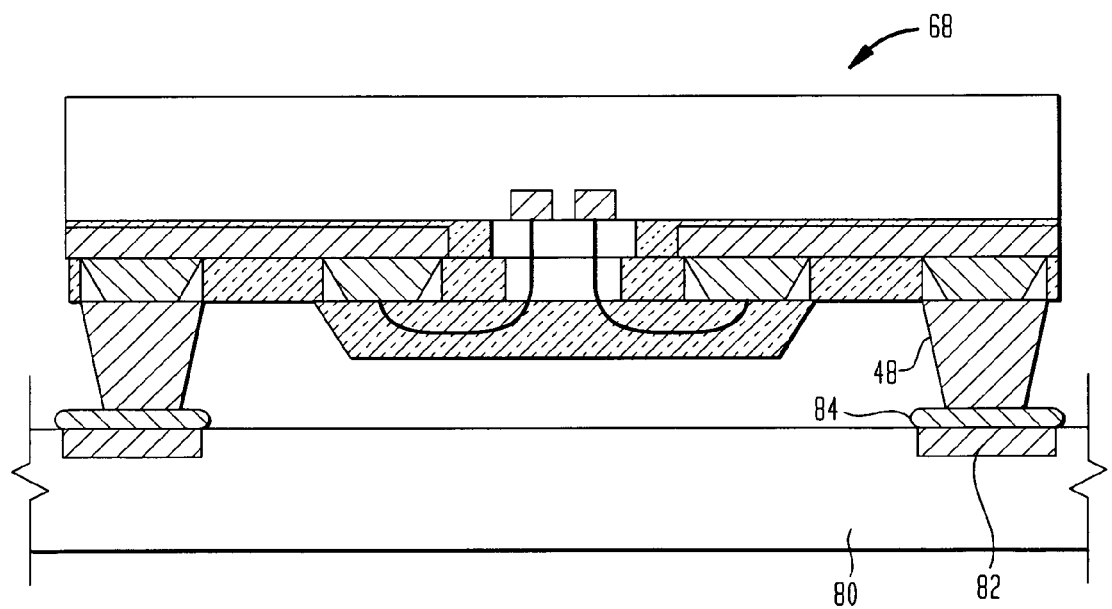
FIG. 5 is a diagrammatic sectional view depicting an assembly incorporating the packaged microelectronic element of FIG. 4 in conjunction with a circuit board.

Packaged microelectronic element 68 may be mounted to a circuit panel such as a circuit board 80, partially illustrated in FIG. 5. Posts 48 may be bonded to contact pads 82 on the top surface of the circuit board using conventional surface-mounting techniques. Preferably, only a thin layer of a bonding material such as a solder 84 is provided between the tips of the posts and the contact pads. Some of the bonding material may also extend upwardly along the posts (not shown), so that the ends of the posts remote from dielectric layer 22 are engaged within masses of bonding material. In the conventional manner, circuit panel 80 includes conductive elements such as traces (not shown) connecting the contact pads 82 with other elements of an electronic circuit. Encapsulant 78 remains clear of the circuit board top surface.

In the completed circuit, the posts 48 desirably can move or tilt slightly to accommodate movement of the contact pads 82 on the circuit board relative to the contact 74 of the chip as may be caused, for example, by differential thermal expansion and contraction of the elements during operation and contraction during manufacture as, for example, during the solder bonding process. The posts may also bend slightly to accommodate such movement.

The depictions in FIG. 1-5 are simplified for clarity of illustration. Typically, the component includes more than one row of posts on each side of the slot. As seen in the bottom plan view of FIG. 6, the dielectric layer 22 may be generally rectangular, and slot 66 may be elongated. One or more rows of pads 30b are provided in slot-edge regions adjacent the edges of the slot, whereas numerous rows of posts 48 are provided in other regions of the dielectric layer. The pads 30b are connected to the posts 48 by traces 58 as discussed above. As also shown in FIG. 6, each pad may be connected to one or more posts, and the posts may be interconnected with one another by some of the traces. For clarity of illustration, only a few of the traces 58 are shown in FIG. 7. As mentioned above, the dielectric layer 22 may have embedded conductive features such as ground planes. Further, the conductive features formed in the same operations as traces 58 may also include other conductive elements as, for example, electrically-conductive planes which serve as ground or power planes and which may be connected to some of the posts and/or pads.

It is not essential to provide the slot in the center of the dielectric element. Thus, the slot 66 can be offset from the center of the dielectric element. Also, two or more slots can be provided in a single dielectric element. In a further modification, the slot may be replaced by a set of discrete openings, each encompassing one or more of the contacts 74 on the chip, and the wire bonds may extend through these openings.

A packaged chip 168 (FIG. 7) in accordance with a further embodiment of the invention includes a connection component having a dielectric layer 122, pads 130b, posts 148 and electrically-conductive features such as traces 158 fabricated in substantially the same manner as discussed above and similar to the corresponding features discussed above. In this embodiment, however, the dielectric layer has opposed edges 102 and 104, and the pads 130b are formed in edge regions of the dielectric layer adjacent these edges. In this embodiment as well, a chip or other microelectronic element 170 is mounted with its front or contact-bearing face facing downwardly toward the dielectric element. The chip has opposed edges 106 and 108, and edge regions of the chip front surface project outwardly beyond edges 102 and 104 of the dielectric layer. The contacts 174 of the chip are disposed in these edge regions of the chip front surface as, for example, by providing one or more rows of contacts in each edge region. The wire bonds 176 extend from the contacts 174 and extend around the edges 102 and 104 of the dielectric element. An encapsulant 178 covers the wire bonds and covers the edge regions of the chip and the edge regions of the dielectric element. In a further variant, the encapsulant may also cover the edges of the chip so as to provide physical protection to the edges of the chip. Alternatively, a further overmold may be provided around the chip. It is not essential to provide pads and wire bonds at only two opposed edges. For example, the pads and wire bonds may be provided at four edges of a rectangular dielectric element, and the chip may have edge regions extending beyond all of those edges. Conversely, the chip may extend beyond only one edge of the dielectric element, and pads may be provided only at that edge. Also, the edge pad approach exemplified in FIG. 7 may be combined with the slot edge pads as shown in FIG. 6 so that pads are provided both at the outer edges of the dielectric element and along the edges of one or more slots in the dielectric element.

Figure 8:
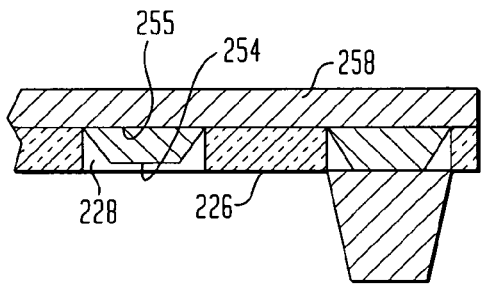
FIG. 8 is a fragmentary, diagrammatic sectional view depicting a portion of a connection component in accordance with yet another embodiment of the invention.

In the embodiments discussed above, the pads have exposed surfaces substantially flush with the outer or bottom surface of the dielectric element. However, as shown in fragmentary sectional view in FIG. 8, the pads may have exposed surfaces 254 recessed above the outer surface 226 of the dielectric element. Pads of this type can be fabricated using an etching process similar to that discussed above with reference to FIGS. 2 and 3 to treat the outer conductive layer, except that the etching step is continued for a time beyond that required to fully remove the outer conductive layer at the pad locations. The recessed pads provide a greater differential between the height of the pads and the height of the posts, and hence provide increased clearance for the thickness of wire bonds and encapsulant. The thickness of the pads can be reduced further, and indeed can be reduced to zero so that the exposed surfaces of the pads are defined by surfaces 255 of the leads themselves, exposed at the bottom surface 226 through the holes 228 in the dielectric layer at the pad locations. Such a configuration may be used, for example, in a component having a thin dielectric layer so that even with a zero-thickness pad, the exposed surfaces 255 are close enough to the bottom surface 226 of the dielectric layer for wire-bonding.

Figure 9:
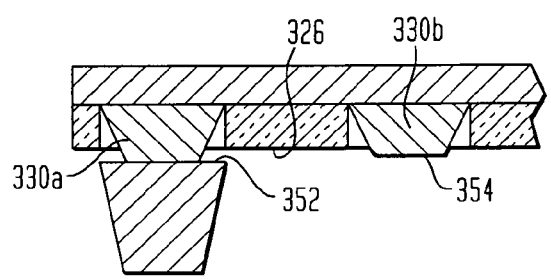
FIG. 9 is a view similar to FIG. 8, but depicting a component according to yet another embodiment of the invention.

Conversely, the component of FIG. 9 includes pads 330b extending downwardly from the outer surface 326. The pads, and particularly the exposed surfaces 354 of the pads, thus project downwardly beyond the outer surface. The posts 348 include upper portions 330a which project below the outer surface 326, so that the base surfaces 352 of the posts stand off from the outer surface of the dielectric layer. Here again, the height of the posts exceeds the height of the pads, so that wire bonds and encapsulant (not shown) can be accommodated. Components of this configuration may be made, for example, by initially making the connectors with a height greater than the thickness of the dielectric layer, and providing the connectors with an etch-resistant layer so that the connectors will not be attacked substantially by the etchant used to remove portions of the outer conductive layer and form the posts.

In the embodiments discussed above, the entire thickness of the outer conductive layer, such as layer 34 (FIGS. 2 and 3) is removed at the pad locations 44. However, this is not essential; a part of the thickness of the outer conductive layer may be left in place at the pad locations, so that a portion of the outer conductive layer is left as a part of each pad. For example, spots of an etch-resistant material can be applied at the pad locations after the outer conductive layer has been etched to a certain extent. Alternatively, the outer conductive layer may be provided as a composite layer including two layers of copper or other readily etched conductive material with spots of an etch-resistant material such as gold disposed between these layers at the pad locations. In this case, the etching process will be arrested at the pad locations when it reaches the boundary between the layers.

Figure 1:
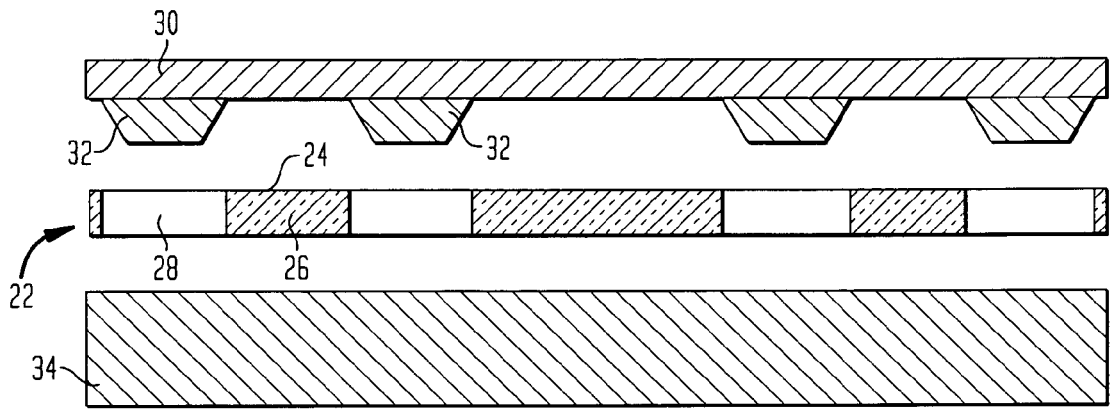
FIG. 1 is a diagrammatic sectional view depicting elements of a connection component during one stage in a method according to one aspect of the invention.

Also, in the processes discussed above, the entire thickness of the outer conductive layer remains in place at the post locations, so that the posts have projection distance $D_P$ (FIG. 3) equal to the original thickness of the outer conductive layer 34 (FIGS. 1 and 2). However, this is not essential; some portion of the original thickness of the outer conductive layer may be removed during treatment. Stated another way, none or some of the thickness of the outer conductive layer may be removed at the post locations, and some or all of thickness of the outer conductive layer may be removed at the pad locations. However, it is desirable to remove more of said outer conductive layer at the pad locations than at post locations, so as to leave the posts projecting downwardly beyond the pads.

Figure 10:
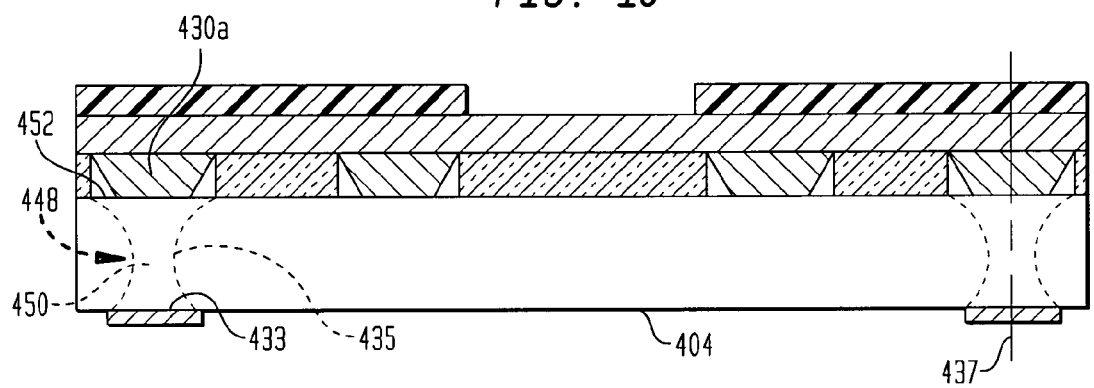
FIG. 10 is a diagrammatic sectional view depicting a component in accordance with another embodiment of the invention during a stage in a fabrication process.
Figure 11:
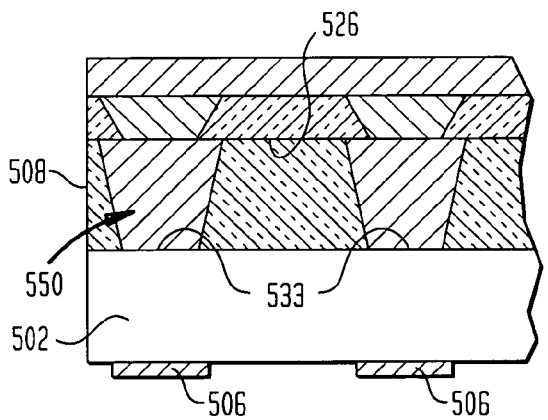
FIGS. 11 and 12 are diagrammatic sectional views depicting a component in accordance with a still further embodiment of the invention during successive stages in formation of such component.

In the discussion above, the posts have been idealized as substantially frustoconical elements. However, it is not essential for the posts to have this shape. As seen in FIG. 10, and as discussed in greater detail in the aforementioned U.S. Pat. No. 6,177,636, posts may be formed by applying an etch-resistant material, which may be a photoresist or a corrosion-resistant metal such as nickel, gold or the like, on a surface 404 of a metallic plate or sheet. After application of the etch-resistant material, an etchant is applied to this surface, typically in the form of a spray directed normal to the surface 404. The metal of the plate or sheet may be etched to form posts 448 having the configuration shown in broken lines in FIG. 11. In this configuration, the lower portions 450 of posts 448 have a "cooling tower" shape. Each such lower portion has a base 452 connected to the upper portion 430a, a tip 433 remote from the base and an intermediate portion 435 between the base and tip. The intermediate portion 435 is narrower than the tip portion 433 and narrower than the base 431, so that the post tapers inwardly in the direction from the base to the intermediate portion and tapers outwardly from the intermediate portion to the tip. Where spots 402 of the etch-resistant material are round, the posts typically have the shape of bodies of revolution about axes 437 extending normal to surface 404 and normal to the surface of remaining portion 428. Where the etch-resistant material 402 is a photoresist or other material which is not desired in the final product, the etch-resistant material may be removed before further processing. Alternatively, if the etch-resistant material is a corrosion-resistant metal such as nickel or gold, it may be left in place.

Figure 12:
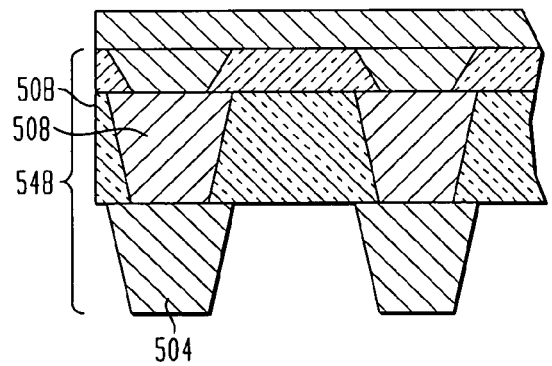

A further embodiment of the invention provides, elongated posts 548 (FIG. 12). In one stage of the post-forming process, a first set of post portions 550 (FIG. 11) projecting from a surface 526 such as a surface of a dielectric element. Post portions 550 may be formed by any process, but desirably are formed by a process as discussed above. After formation of portions 550, a metallic or other conductive layer 502 is applied over the tips 533 of post portions 550. Layer 502 is selectively treated so as to remove material of the layer remote from post portions 550, but leave at least part of the layer thickness overlying post portions 550, and thereby form additional post portions 504 (FIG. 12) aligned with post, portions 550. The treatment applied to layer 502 may include an etching process as discussed above, using spots of an etch-resistant material 506 aligned with post portions 550. A protective layer such as a dielectric encapsulant 508 may be applied to cover post portions 550 before etching layer 502. Alternatively or additionally, post portions 550 may be plated or otherwise covered with an etch-resistant conductive material such as nickel or gold before etching layer 502.

The process of building up successive post portions may be repeated so as to form additional portions below portions 504, so that posts of essentially any length can be formed. The long posts provide increased flexibility and movement of the post tips. Where one or more dielectric encapsulant layers are left in place around the already-formed post portions, such as layer 508 in FIGS. 11 and 12, the encapsulant desirably is compliant so that it does not substantially limit flexure of the posts. In other embodiments, the encapsulant is removed before the components are used. Although the posts are illustrated in conjunction with a dielectric substrate 522 and traces 528 similar to those discussed above, this process can be used to fabricate posts for essentially any structure.

Figure 13:
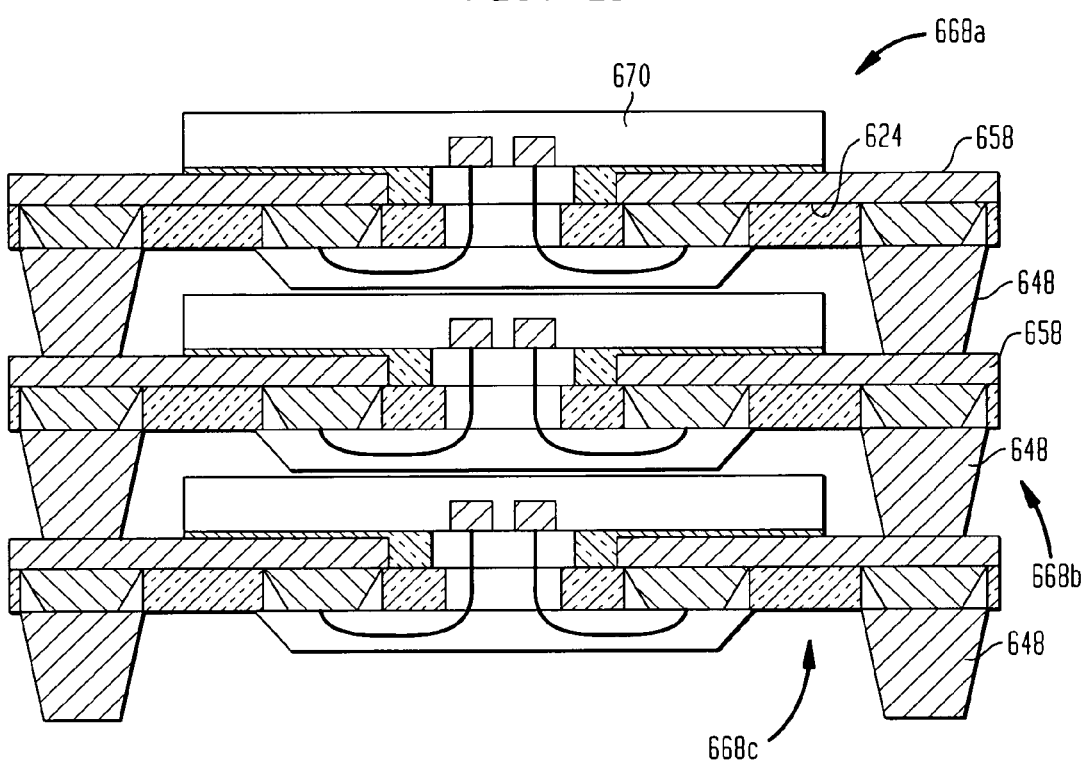
FIG. 13 is a diagrammatic sectional view of an assembly incorporating a plurality of packaged semiconductor chips according to yet another embodiment of the invention.

The connection components discussed above can be utilized in assemblies which are mated with sockets rather than surface-mounted to a circuit board. For example, a packaged semiconductor chip as discussed above can be mounted to a socket, with each of the posts extending into a mating hole in the socket and making electrical contact with a contact of the socket. Certain suitable sockets are described in embodiments of U.S. Pat. Nos. 5,802,699; 5,980,270 and 5,615,824, the disclosures of which are incorporated by reference herein. In a further alternative, the socket arrangement can be used as a temporary test fixture and, after testing, the assembly can be solder-bonded or otherwise bonded to a circuit board. In still further arrangements, the components can be used as elements of stacked assemblies. For example, the assembly depicted in FIG. 13 includes several packaged microelectronic elements 668a, 668b and 668c, each similar to the packaged element 68 of FIG. 4, stacked one above the other, so that each such packaged microelectronic element serves as a single unit in a multi-unit stacked assembly. Each unit has upwardly-facing conductive elements, such as portions of traces 658 projecting beyond chips 670 and, exposed at the upper or inner surface 624 of the dielectric element. The upwardly-facing conductive elements of unit 668c are connected to the posts 648 of the next higher unit 668b in the stack, whereas the upwardly-facing conductive elements of unit 668b are connected to the posts 648 of unit 668a, so that the posts serve as vertical interconnection elements between the various units. Other features of stacked packages are described, for example, in U.S. Patent Publications 20030107118A1 and 20040031972A1, the disclosures of which are incorporated by reference herein.

Features other than posts and pads can be made using the processes discussed herein. For example, a thermally conductive element may be provided by leaving some or all of the thickness of the outer conductive layer during an etching or other treatment step as discussed above. Such a thermally conductive element may have a height equal to the height of the posts, and may have a cross-sectional area greater than the cross-sectional area of an individual post. The use of thermally-conductive elements is described in greater detail in the co-pending, U.S. Provisional Application No. 60/583,066, filed Jun. 25, 2004, entitled "MICROELECTRONIC PACKAGES AND METHODS THEREFOR," naming Belgacem Haba as an inventor, the disclosure of which is incorporated by reference herein.

Figure 14:
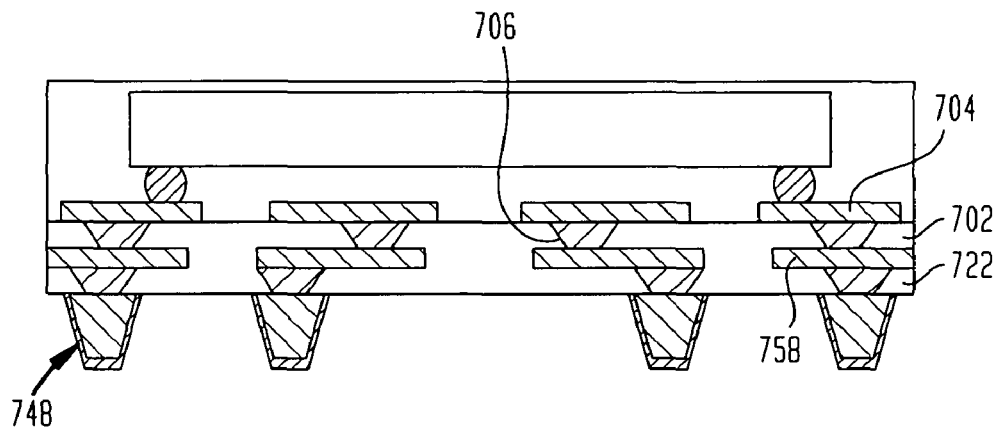

The assemblies discussed above include relatively simple components with only a single layer of conductive traces, discussed above. However, more than one layer of traces can be used, and other conductive features such as conductive planes can be included. For example, as shown in FIG. 14, a component with plural layers of traces may be formed with an additional dielectric layer 702 having additional traces 704 and additional connectors 706 extending through such additional dielectric layer to conductive features such as traces 758 on a first dielectric layer 722. The additional dielectric layer 702 desirably is laminated to the first dielectric layer after formation of the traces 758 on the first dielectric layer; this may occur before or after formation of posts 748 and before or after lamination of the first dielectric layer with the outer conductive layer used to form the posts. In the embodiments discussed above, the traces, such as traces 58 (FIGS. 3-5) extend along a surface of the dielectric layer. However, this is not essential; traces or other conductive features can be disposed within a dielectric layer. For example, in FIG. 14, traces 758 extend within a composite dielectric layer incorporating layers 702 and 722. As used in this disclosure, when a conductive element is said to be "on" a dielectric element or layer, the conductive element need not be disposed on a surface of the dielectric, but instead, may be disposed within the dielectric. That is, the word "on" does not imply location at a surface of a dielectric.

Figure 15:
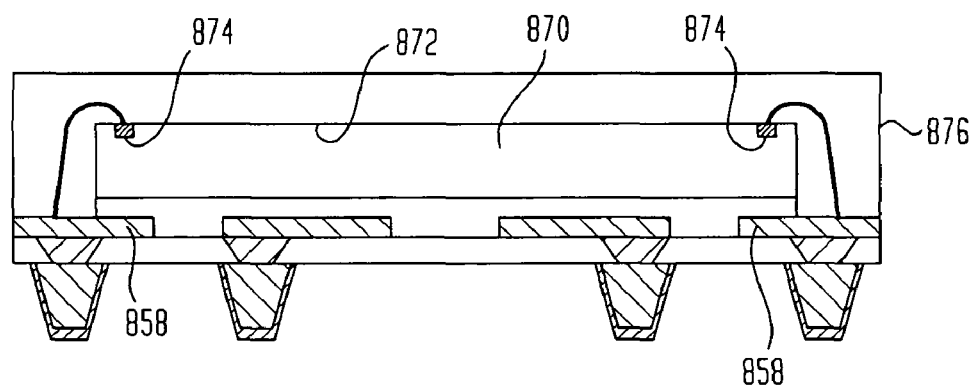
Figure 16:
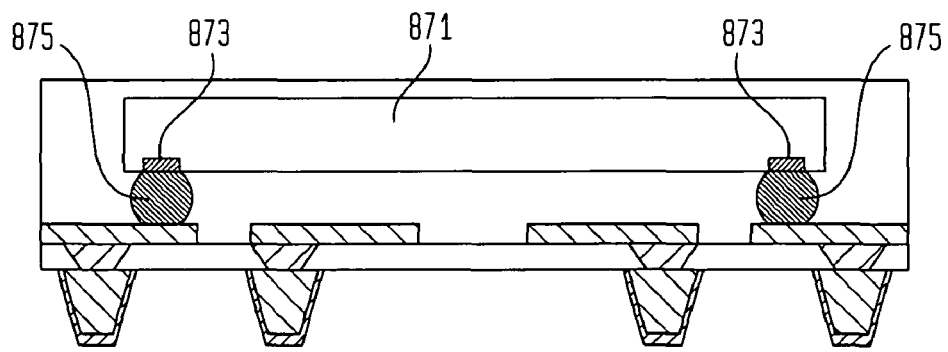
Figure 17:
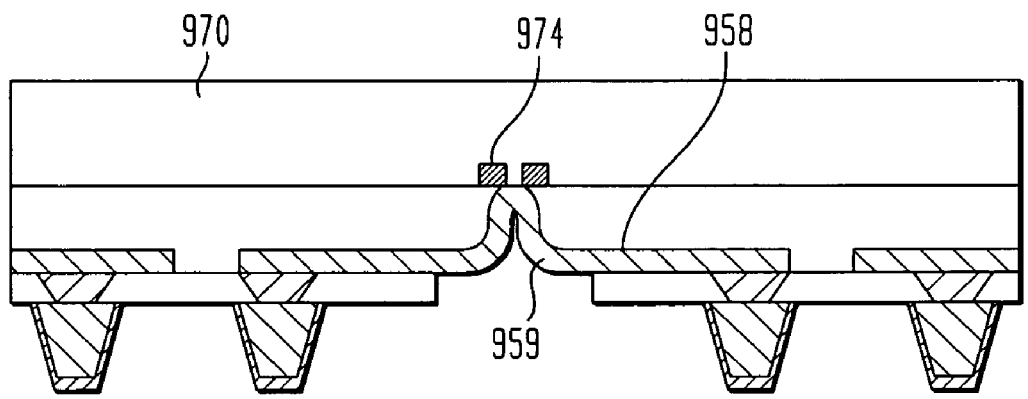

In the embodiments discussed above, the chip or other microelectronic element is disposed in face-down orientation, with the contact-bearing surface facing the dielectric element. However, the connection components made in accordance with the invention can be used to mount microelectronic elements in face-up orientation. For example, as seen in FIG. 15, the packaged microelectronic element includes a chip 870 having contacts 874 on a front surface 872. Front surface 872 faces upwardly, away from the dielectric element and traces. Wire bonds 876 extend downwardly from contacts 874 to traces 858, which in turn are connected to posts 848 as discussed above. In this embodiment, it is not necessary to provide pads exposed on the outer or downwardly-facing surface of the dielectric layer. The process of making the connection component can be performed in substantially the same way as discussed above, except that connectors are not provided at pad locations as discussed above with reference to FIGS. 2 and 3. In a further variant (FIG. 16), the chip 871 has contacts 873 on a downwardly-facing surface, but the contacts are connected to the leads by masses of solder or other bonding material 875, commonly referred to as a "flip-chip" mounting. In this embodiment as well, exposed pads are not required.

In a further variant, (FIG. 17) the traces 958 formed from the inner conductive layer include lead portions 959 formed integrally with the traces. These lead portions as initially formed project partially or completely across a slot 966 in the dielectric element, so that they can be bonded to the contacts 974 of a microelectronic element, such as a chip 970 disposed in face-down orientation. In a further variant, the lead portions may project beyond one or more edges of the dielectric element, so that the lead portions can be bonded to contacts on projecting edges of a chip, such as the contacts 174 shown in FIG. 7.

In yet another variant (FIG. 18), the connection component has both posts 1048 and pads 1030 exposed at the bottom or outer surface 1026 of dielectric element 1022. As in the embodiment discussed above with reference to FIGS. 1-5, the posts 1048 project downwardly beyond the pads. A microelectronic element such as a chip 1070 is mounted below the dielectric element, and is connected to pads 1030 by solder elements 1002 or other bonding technique. This microelectronic element is connected by the pads to traces 1058. A further microelectronic element 1071 optionally is provided above the dielectric element, and is connected to traces 1058 by flip-chip bonding using solder elements 1004. Depending on the configuration of the traces, the traces may connect either or both of chips 1070 and 1071 to posts 1048, and may connect the chips to one another. In this embodiment, the difference in height between the pads and the posts provides room form mounting the bottom chip 1070; the bottom chip does not project below the tips of the posts, and thus does not interfere with connection between the posts and a circuit panel. In other embodiments, some of the pads on the dielectric element may be used to make connections to a chip or other element disposed above the dielectric element, as by a wire-bonding process, whereas other pads may be connected to a chip disposed below the dielectric element.

As these and other variations and combinations of the features discussed above can be utilized without departing from the present invention as defined by the claims, the foregoing description of the preferred embodiments should be taken by way of illustration rather than by way of limitation of the invention as defined by the claims.

The invention claimed is:

1. A method of making a connection component including the steps of:
   removing portions of an outer electrically conductive layer covering an outer surface of a dielectric layer and covering electrically conductive connectors on said dielectric layer so as to remove at least some of said outer electrically conductive layer at pad locations and leave at least some of said outer layer at post locations and thereby form pads at said pad locations and posts at said post locations, said pads and said posts incorporating said connectors, said pads having downwardly facing surfaces exposed at said outer surface, said posts projecting downwardly from said outer surface of said dielectric layer and projecting downwardly beyond said surfaces of said pads; and
   treating an inner electrically conductive layer remote from said outer electrically conductive layer and connected to said pads so as to remove portions of said inner electrically conductive layer and form electrically conductive traces connecting at least some of said pads with at least some of said posts.

2. The method as claimed in claim 1 wherein said step of removing portions of said outer electrically conductive layer includes removing the entire thickness of said outer electrically conductive layer at the pad locations.

3. The method as claimed in claim 1 wherein said step of removing portions of said outer electrically conductive layer includes leaving the entire thickness of said outer electrically conductive layer at said post locations.

4. The method as claimed in claim 1 wherein said step of removing portions of said outer electrically conductive layer includes etching said outer electrically conductive layer.

5. The method as claimed in claim 4 wherein said etching step is performed so as to remove the entire thickness of said outer electrically conductive layer at said pad locations and thereby expose connectors at said pad locations, the method further comprising continuing said etching step after the connectors are exposed so as to remove portions of said connectors, wherein said downwardly-facing exposed surfaces of said pads are recessed above said outer surface of said dielectric layer.

6. The method as claimed in claim 1 wherein said inner and outer electrically conductive layers are metallic layers and said steps of treating said inner and outer metallic layers include simultaneously etching both of said metallic layers.

7. The method as claimed in claim 1 further comprising the step of joining said inner and outer electrically conductive layers, said connectors and said dielectric layer prior to said step of treating said outer metallic layer.

8. The method as claimed in claim 7 wherein said joining step includes providing the dielectric layer with holes extending between said outer surface and said inner surface and laminating said electrically conductive layers and said dielectric layer, one of said electrically conductive layers having said connectors thereon so that said connectors are positioned in said holes during said laminating step.

9. The method as claimed in claim 8 wherein said inner electrically conductive layer has said connectors formed integrally therewith.

10. A method of making a connection component including the step of removing portions of an outer electrically conductive layer covering an outer surface of a dielectric layer and covering electrically conductive connectors on said dielectric layer, an inner electrically conductive layer extending along a major surface of said dielectric layer remote from said outer surface, said connectors extending from said inner electrically conductive layer through said dielectric layer, so as to remove at least some of said outer electrically conductive layer at pad locations and leave at least some of said outer layer at post locations and form electrically conductive pads at said pad locations and electrically conductive posts at said post locations, said pads and said posts extending from said inner electrically conductive layer, said pads and said posts incorporating said connectors, said pads having downwardly facing surfaces exposed at said outer surface, said posts projecting downwardly from said outer surface of said dielectric layer and projecting downwardly beyond said surfaces of said pads.

11. A method as claimed in claim 10, wherein at least one of said pads is adapted for at least one of solder-bonding or wire-bonding to a microelectronic element.

12. A method as claimed in claim 10 wherein at least one of said pads is electrically connected with at least one of said posts.

13. The method of claim 10, wherein said step of removing portions of said outer electrically conductive layer includes etching said outer electrically conductive layer.

14. The method of claim 10, wherein said inner and outer electrically conductive layers are metallic layers and said steps of treating said inner and outer metallic layers include simultaneously etching both of said metallic layers.

15. A method of making a connection component including the step of removing portions of an outer electrically conductive layer covering an outer surface of a dielectric layer and covering electrically conductive connectors on said dielectric layer so as to remove at least some of said outer electrically conductive layer at pad locations and leave at least some of said outer layer at post locations and thereby form pads at said pad locations and posts at said post locations, said pads and said posts incorporating said connectors, said pads having downwardly facing surfaces exposed at said outer surface, said posts projecting downwardly from said outer surface of said dielectric layer and projecting downwardly beyond said surfaces of said pads, wherein the step of removing portions of said outer electrically conductive layer includes etching said outer electrically conductive layer, so as to remove the entire thickness of said outer electrically conductive layer at said pad locations and thereby expose connectors at said pad locations, the method further comprising continuing said etching step after the connectors are exposed so as to remove portions of said connectors, wherein said downwardly-facing exposed surfaces of said pads are recessed above said outer surface of said dielectric layer.

\* \* \* \* \*